United States Patent [19]

Heitmann et al.

[11] Patent Number: 4,672,012

[45] Date of Patent: Jun. 9, 1987

[54] PROCESS FOR MODIFYING STRUCTURAL PROFILES IN RESIST LAYERS

[75] Inventors: Knut Heitmann; Martin Hoppe; Eckhard Schneider, all of Wetzlar; Andreas Thaer, Leihgestern, all of Fed. Rep. of Germany

[73] Assignee: Ernst Leitz Wetzlar GmbH, Wetzlar, Fed. Rep. of Germany

[21] Appl. No.: 733,306

[22] Filed: May 13, 1985

[30] Foreign Application Priority Data

May 21, 1984 [DE] Fed. Rep. of Germany ....... 3418856

[51] Int. Cl.$^4$ ............................ G03F 7/00; G03F 7/02; G03F 7/26
[52] U.S. Cl. ............................................. 430/3; 430/328
[58] Field of Search ....................... 156/626, 627, 628; 430/3, 328; 73/589, 606

[56] References Cited

U.S. PATENT DOCUMENTS 3,962,004 6/1976 Sonneborn ............................ 430/3

*Primary Examiner*—Howard A. Birmiel
*Attorney, Agent, or Firm*—Schwartz, Jeffery, Schwaab, Mack, Blumenthal & Evans

[57] ABSTRACT

A process for modifying structural profiles produced by polymerization or depolymerization in resist layers. As a function of the acoustic impedance of the substrate carrying the resist layer, the structures are irradiated with an ultrasonic beam. An ultrasonic beam for which the substrate represents a high impedance is used in order to enhance the contrast of the structures. An ultrasonic beam for which the substrate represents a low impedance is used to weaken the contrast. An acoustic microscope is especially suitable for carrying out the process.

5 Claims, No Drawings

PROCESS FOR MODIFYING STRUCTURAL PROFILES IN RESIST LAYERS

BACKGROUND OF THE INVENTION

The invention relates to a process for determining structural profiles produced in resist layers by polymerization or depolymerization.

The term resist is defined herein as a substance capable of being applied to the surface of a substrate in order to mask the part of the subtrate the substance covers, i.e., to protect the substrate against the attack of etching agents, chemical or galvanic metallizing baths, or the like. Resists, such as photosensitive resists, have the property that their solubility may be varied by exposure to UV, electron, x-ray or ionic radiation. During exposure, polymers are either formed and cross-linked (so-called negative layers), or polymers are broken up and converted into low molecular weight soluble compounds (so-called positive layers). This property of solubility variation in irradiated or non-irradiated areas of the resist surface is utilized for the production of a washout relief on the surface of the substrate. The structural profile of this washout relief depends on the material of the resist, the thickness of the resist layer, the duration and intensity of the radiation, and also on chemical development and fixation processes. While the material dependent effects may be largely controlled, the degree of cross-linking or fragmentation of the polymers obtained is uncertain. In the case of the known processes, the degree of cross-linking or fragmentation becomes visible only after chemical development. At that point, it is too late for correction.

SUMMARY OF THE INVENTION

It has now been discovered by the present inventors, and described in U.S. patent application Ser. No. 733,305, that a cross-linking or fragmentation induced in a resist layer with a known lithographic process may be accelerated and, above all, continued by ultrasonic irradiation.

It is therefore an object of the present invention to further develop the above process so that it will be possible not only to complete the lithographically induced process by means of ultrasonic irradiation, but also to reversibly manipulate the structural profile in the resist layer at the lithographically affected locations.

In accordance with the above object, there has been provided a process for modifying a structural profile produced by polymerization, or depolymerization, of a first resist layer carried on a substrate layer, comprising the steps of (a) selecting a first ultrasonic frequency for producing a given contrast as a function of an acoustical impedance of the substrate; and (b) irradiating the resist layer with ultrasonic waves having the selected first ultrasonic frequency. Preferably, step (b) is conducted using an acoustic microscope, and further comprising, after step (b), the steps of (c) visualizing the structural profile with the acoustic microscope; (d) ascertaining whether the visualized structure meets predetermined criteria; and (e) repeating the foregoing steps (a) through (d) if the visualized structure does not meet the predetermined criteria. Additionally, step (a) may comprise one of selecting an ultrasonic frequency highly impeded by the substrate for producing enhanced contrast in the profile, and selecting an ultrasonic frequency weakly impeded by the substrate for producing reduced contrast in the structural profile.

In one embodiment, the process further comprises before step (b), the step of intercalating a second intermediate layer between the first resist layer and the substrate, wherein step (a) comprises selecting a frequency antireflected by the second layer.

In another embodiment, step (a) comprises selecting a frequency highly impeded by said substrate layer, and for producing standing waves in said resist layer.

DETAILED DESCRIPTION OF THE PREFERRED EMBODIMENTS

The invention is based on the discovery that ultrasonic waves penetrating into a resist layer, by means of an acoustic coupling medium, affect the preexposed polymer structure of the resist differentially as a function of the acoustic impedance of the substrate located underneath. A high acoustic impedance of the substrate leads to an enhancement of the contrast in the acoustic image of the cross-linked or fragmented structure in the resist, i.e., a broadening of lines, and a low impedance to a weakening of the contrast, which could result in the extinction of the structure. As acoustic impedance depends on the ultrasonic frequency irradiated, the structural profile in the resist may be affected by the choice of appropriate ultrasonic frequencies in the case of a given substrate in a desired manner.

The aforedescribed effect may be taken into consideration, in the preparation of the resist layer, by initially applying an intermediate layer to the substrate, the acoustic impedance of which is adapted to selected ultrasonic fequencies only. "Adaptating the acoustic impedance" means, in addition to the frequency dependent adaptation of the material of the intermediate layer, primarily the adaptation of the layer thickness to the acoustic path length in the material, so that the intermediate layer will act as an antireflection coating for acoustic waves.

In certain specific applications, the intermediate layer should be optically transparent. This is important particularly in the case of objects where the end product after the development of the resist layer is to be optically transparent. If, for example, a sapphire wafer is chosen as the substrate, a $\lambda/4$ glass layer may be applied as the intermediate layer. The selected ultrasonic frequencies for which the adaptation is achieved, are then used to weaken the contrast of the structural profile in the resist layer. This leaves more freedom in the selection of the contrast enhancing ultrasonic frequencies.

For the preparation of diffraction gratings, it is frequently desirable to be able to affect the structural profile in the resist layer in its third dimension also, in order to be able to produce, for example, a sinusoidal phase structure, or a structure with a certain blaze angle. In this application, an ultrasonic beam may be used whose frequency is subject to a high impedance by the layer under the resist layer, and whose wave length produces standing waves in the resist layer. The lithographic process requires only that the grating constant be determined. The shape of the grating is produced, for example, by the direction of the ultrasonic irradiation, in which standing waves are formed in the resist layer.

An acoustic lens assembly with adjustable frequency is particularly appropriate for the irradiation. Preferably, an acoustic microscope may be used, so that the structural profile attained may be visualized.

What is claimed is:

1. A process for modifying a structural profile produced by polymerization, or depolymerization, of a first resist layer carried on a substrate layer, comprising the steps of:
    (a) selecting a first ultrasonic frequency for producing a given contrast as a function of an acoustical impedance of the substrate; and
    (b) irradiating said first resist layer with ultrasonic waves having the selected first ultrasonic frequency.

2. A process as recited in claim 1, wherein said step (a) comprises one of selecting an ultrasonic frequency highly impeded by said substrate for producing enhanced contrast in said profile, and selecting an ultrasonic frequency weakly impeded by said substrate for producing reduced contrast in said structural profile.

3. A process as recited in claim 1, further comprising, before said step (b), the step of intercalating a second intermediate layer between said first resist layer and said substrate, wherein said step (a) comprises selecting a frequency antireflected by the second intermediate layer.

4. A process as recited in claim 1, wherein said step (a) comprises selecting a frequency highly impeded by said substrate layer for producing standing waves in said resist layer.

5. A process as recited in claim 1, wherein said step (b) is conducted using an acoustic microscope, and further comprising, after step (b), the steps of:
    (c) visualizing said structural profile with the acoustic microscope;
    (d) ascertaining whether the visualized structure meets predetermined criteria; and
    (e) repeating the foregoing steps (a) through (d) if the visualized structure does not meet the predetermined criteria.

* * * * *